United States Patent
Staszewski et al.

(10) Patent No.: US 7,440,511 B2
(45) Date of Patent: Oct. 21, 2008

(54) TRANSMIT FILTER

(75) Inventors: Robert B. Staszewski, Garland, TX (US); Dirk Leipold, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 1036 days.

(21) Appl. No.: 10/001,448

(22) Filed: Oct. 31, 2001

(65) Prior Publication Data

US 2002/0186782 A1 Dec. 12, 2002

Related U.S. Application Data (60) Provisional application No. 60/286,572, filed on Apr. 25, 2001, provisional application No. 60/313,751, filed on Aug. 20, 2001.

(51) Int. Cl.
*H04L 27/00* (2006.01)
(52) U.S. Cl. ................................ 375/295
(58) Field of Classification Search ........... 375/355, 375/371, 373, 374, 375, 376; 327/141, 154, 327/155; 713/400, 401; 330/295
See application file for complete search history.

(56) References Cited

U.S. PATENT DOCUMENTS

| | | | |
|---|---|---|---|
| 4,617,679 A | 10/1986 | Brooks | |
| 5,724,396 A * | 3/1998 | Claydon et al. | 375/355 |
| 5,732,106 A * | 3/1998 | Rasmussen et al. | 375/296 |
| 6,008,703 A | 12/1999 | Perrott et al. | |
| 6,608,511 B1 * | 8/2003 | Hsu | 327/157 |
| 6,738,922 B1 * | 5/2004 | Warwar et al. | 713/503 |
| 2002/0061082 A1* | 5/2002 | Balakrishnan et al. | 375/355 |

FOREIGN PATENT DOCUMENTS

EP 0 153 107 A1 8/1985

* cited by examiner

*Primary Examiner*—Robert J. Pascal
*Assistant Examiner*—Krista M Flanagan
(74) *Attorney, Agent, or Firm*—Ronald O. Neerings; Wade James Brady, III; Frederick J. Telecky, Jr.

(57) ABSTRACT

A transmit filter (100) receives a stream of data symbols (DT_TX) at a baseband symbol clock rate. An available clock (FREF) is used to generate sample points for producing a generating an oversampled signal. The available clock is independent from the baseband symbol clock, and does not need to be an integer multiple of the clock. Upon identifying a start sequence in the data stream, a phase tracking circuit (106) is used to determine a current position relative to the baseband symbol clock. A state circuit (104) stores the last three, or more, data symbols. Based on the last three data symbols (which determines the shape of the curve for the current data symbol) and the current position (which determines the current position on the curve), a filter circuit (108) generates a sample point.

36 Claims, 6 Drawing Sheets

TRANSMIT FILTER

CROSS-REFERENCE TO RELATED APPLICATIONS

This application claims the benefit of the filing date of copending provisional applications U.S. Ser. No. 60/286,572, filed Apr. 25, 2001, entitled "Frequency Synthesizer Architecture of the Digital Radio Processor (v2.0)" to Staszewski et al and U.S. Ser. No. 60/313,751, filed Aug. 20, 2001, entitled "Transmit Filter" to Staszewski et al.

STATEMENT OF FEDERALLY SPONSORED RESEARCH OR DEVELOPMENT

Not Applicable

BACKGROUND OF THE INVENTION

1. Technical Field

This invention relates in general to communication circuits and, more particularly, to a circuit for transmit modulation.

2. Description of the Related Art

A great reduction of the transistor features in recently developed deep-submicron CMOS processes shifts the design paradigm towards more digitally-intensive techniques. In a monolithic implementation, the manufacturing cost of a design is measured not in terms of a number of devices used but rather in terms of the occupied silicon area, no matter what the actual circuit complexity.

Analog and RF circuits used in communication circuits, however, are not easily implemented in a deep-submicron CMOS process. For example, in Texas Instruments' CMOS process (C035) of 0.08 μm L-effective features a digital gate density of 150K equivalent (2-input NAND) gates per mm$^2$. An average-size inductor for an integrated LC oscillator occupies about 0.5 mm$^2$ of silicon area. A low-noise charge pump, or a low-distortion image-reject modulator, both good examples of classical RF transceiver components, occupy roughly about the same area, which could be traded for tens of thousands of digital gates.

Migrating to a digitally-intensive synthesizer architecture brings forth the following well-known advantages: (1) fast design turn-around cycle using automated CAD tools (VHDL or Verilog hardware-level description language, synthesis, auto-place and auto-route with timing-driven algorithms, parasitic backannotation and postlayout optimization), (2) much lower parameter variability than with analog circuits, (3) ease of testability, (4) lower silicon area and dissipated power that gets better with each CMOS technology advancement (also called a "process node") and (5) excellent chances of first-time silicon success. Commercial analog circuits usually require several design iterations to meet marketing requirements.

There is a wide array of opportunities that integration presents. The most straightforward way would be to merge various digital sections into a single silicon die, such as DRAM or Flash memory embedded into DSP or controller. More difficult would be integrating the analog baseband with the digital baseband. Care must be taken here to avoid coupling of digital noise into the high-precision analog section. In addition, the low amount of voltage headroom challenges one to find new circuit and architecture solutions. Integrating the analog baseband into RF transceiver section presents a different set of challenges: the conventional Bi-CMOS RF process is tuned for high-speed operation with a number of available passive components and does not fundamentally stress high precision.

Sensible integration of diverse sections results in a number of advantages: (1) lower total silicon area—in a deep-submicron CMOS design, the silicon area is often bond-pad limited; consequently, it is beneficial to merge various functions on a single silicon die to maximize the core to bond-pad ratio, (2) lower component count and thus lower packaging cost, (3) power reduction—no need to drive large external inter-chip connections and (4) lower printed-circuit board (PCB) area, thus saving the precious "real estate."

Deep-submicron CMOS processes present new integration opportunities on one hand, but make it extremely difficult to implement traditional analog circuits, on the other. One such problem is the transmission of digital data. Currently, such transmission is implemented using a baseband chip clock that is an integral multiple of the baseband symbol clock frequency. For example, if symbols are generated at a 1 MHz frequency, an 8 MHz baseband chip clock could be implemented to produce eight chips per symbol.

Generation of the chip clock, however, can be costly, often requiring the presence of a PLL, which can use valuable real estate.

Therefore, a need has arisen for a method and apparatus for digital data transmission that minimizes the cost in chip area.

BRIEF SUMMARY OF THE INVENTION

In the present invention, an oversampled signal is generated from a stream of data symbols generated responsive to a symbol clock. Responsive to a reference clock generated independently from the symbol clock, phase information relative to the symbol clock is maintained. Samples are generated responsive to said phase information and said reference clock.

The present invention provides a significant advantage over the prior art. Any available clock can be used as the reference clock, so long as it can generate a sufficient number of samples per symbol clock. Since a communication circuit will typically have an available clock, such as a crystal reference clock used for other purposes in the device, that would have an adequate frequency for the sample generation, the cost in chip area and power consumption is avoided.

BRIEF DESCRIPTION OF THE SEVERAL VIEWS OF THE DRAWINGS

For a more complete understanding of the present invention, and the advantages thereof, reference is now made to the following descriptions taken in conjunction with the accompanying drawings, in which:

FIG. 8b illustrates a timing diagram of the operation of the phase tracking circuit of FIG. 8a;

DETAILED DESCRIPTION OF THE INVENTION

The present invention is best understood in relation to FIGS. 1-15 of the drawings, like numerals being used for like elements of the various drawings.

Figure 1:
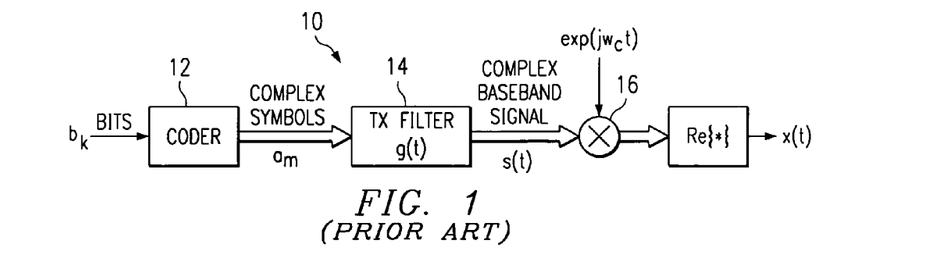
FIG. 1 shows a general block diagram of a transmit pulse amplitude modulation (PAM) using complex signals.

FIG. 1 shows a general block diagram of a transmit pulse amplitude modulation (PAM) device 10 using complex signals. It mathematically describes an arbitrary modulation process. The incoming bit stream $b_k$ is fed to a coder 12, which converts the "0" or "1" digital bits into a stream of symbols $a_m$. A symbol assumes values from an alphabet. Since the coder may map multiple bits into a single data symbol, a distinction generally must be made between the symbol rate and the bit rate. In Bluetooth there is a one-to-one correspondence between the bits and symbols: $\{0,1\} \rightarrow \{-1,1\}$. More advanced encoding schemes, such as QPSK, for example, pack two bits into a symbol.

Symbols are applied to a transmit filter 14, which normally produces a continuous-time signal for transmission over the continuous-time channel. The impulse response g(t) of the transmit filter is called the pulse shape and could be Gaussian or raised-cosine. In modern implementations, the pulse shape is oversampled by a chip clock and represented digitally throughout the pulse filtering process, even though the filter output s(t) is usually brought back to the continuous-time domain by performing a digital-to-analog conversion (DAC) and subsequent low-pass filtering. The filter output s(t) is input to image-reject modulator 16.

Figure 4A:
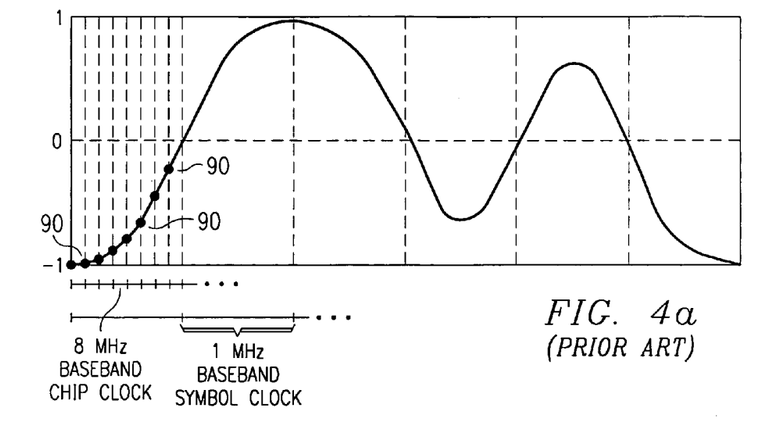
FIG. 4a illustrates the output of a typical transmit filter.

In the prior art, the digital baseband data bits $b_k$ are synchronous to the baseband symbol clock whereas the digital filter output samples are synchronous to the baseband chip clock (see FIG. 4a).

Figure 2:
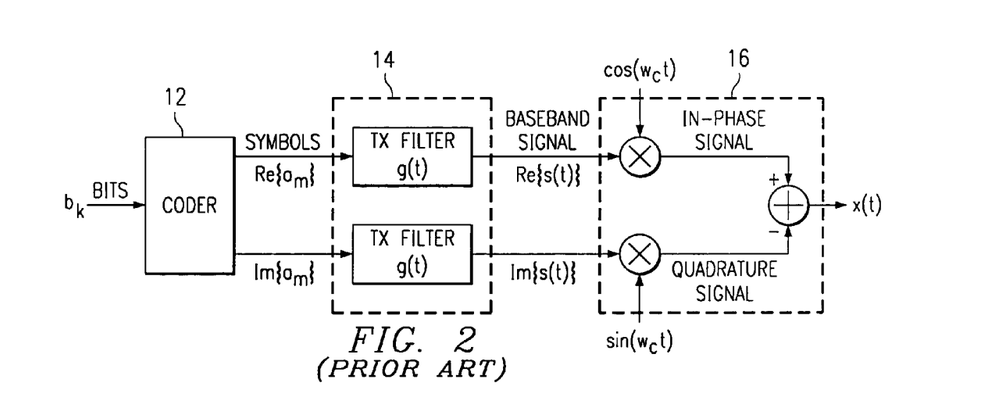
FIG. 2 shows a block diagram of a PAM transmit modulation using in-phase (I) and quadrature (Q) signals.

Complex signal representation requires two physical wires that carry both real-valued parts of a complex number. FIG. 2 shows a block diagram of a PAM transmit modulation device 10 using in-phase (I) and quadrature (Q) signals that represents a natural progression towards a more physically-realizable representation.

Figure 3:
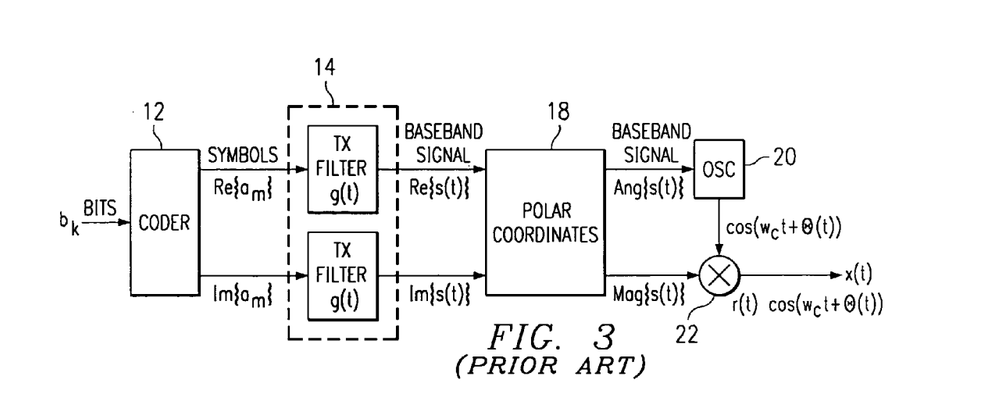
FIG. 3 shows a block diagram of a PAM transmit modulation using a polar alternative in the form of direct amplitude and phase modulation.

FIG. 3 shows a block diagram of a PAM transmit modulation using a polar alternative in the form of direct amplitude and phase modulation. The real and imaginary filter outputs $Re\{s(t)\}$ and $Im\{s(t)\}$ are input to a polar coordinate converter 18. The polar coordinate converter 18 outputs angle and magnitude values $ang\{s(t)\}$ and $mag\{s(t)\}$, respectively. The direct phase modulation might be performed by modulating the oscillator 20 tuning input in a feed-forward manner with a possible PLL loop compensation method. The direct amplitude modulation might be performed by a voltage, current or digitally controlled power amplifier 22 or by regulating the supply voltage to a constant-envelope power amplifier. A preferred embodiment uses a digital pulse slimming circuit. This method is likely to be the best choice for digital integration of mobile RF transceivers because it does not use the RF/analog-intensive up-conversion modulator.

In constant-envelope transmit modulation schemes such as GFSK, which is used in GSM (European cellular phone system) and Bluetooth standards, the dynamic amplitude control is not required and only a slow-varying output power regulation might need to be implemented.

More complex modulation schemes, such as QPSK and 8PSK, require full symbol-rate RF amplitude control. The polar PAM method still is likely to be preferred in this case over the I-Q scheme. Here, a stripped-down version of Envelope Elimination and Restoration Method (without the envelope detection and amplitude limitation parts) could be used, and is based on power-efficient non-linear saturation-mode power amplifiers (PA). In this method, the supply voltage of a non-linear PA is adjusted according to the desired amplitude of the output, while the input signal has a constant envelope with a 50% duty cycle.

Another saturation-mode PA method could be used; Linear Amplification with Nonlinear Components (LINC) adds the two constant-envelope PA outputs of the properly phase shifted signals. However, it is more area-intensive and power-inefficient technique than the previous one and is currently used mainly in base stations.

FIG. 4a illustrates the output of a typical prior art transmit filter. In the example configuration of FIG. 4a, there is a 1 MHz baseband symbol clock (one symbol is transmitted per clock) and an 8 MHz baseband chip clock (eight chips are output per symbol). For each clock cycle of the baseband chip clock, a sample 90 is generated.

Figure 4B:
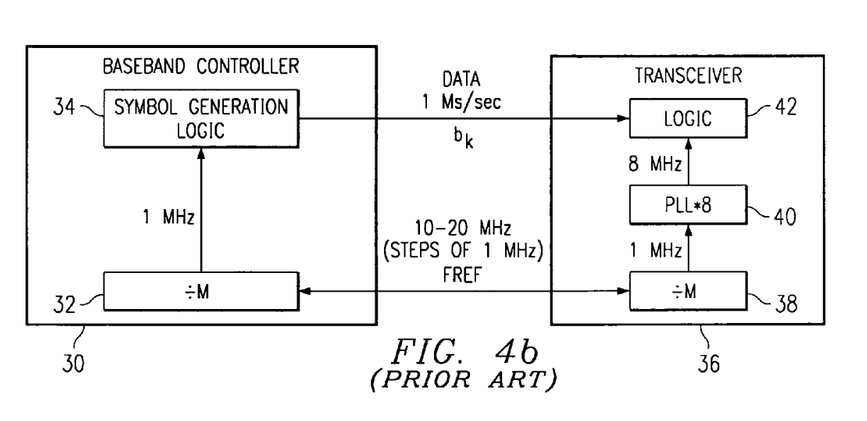
FIG. 4b illustrates a block diagram of a previously designed circuit for baseband chip clock and baseband symbol clock generation.

FIG. 4b illustrates a prior art method of generating a baseband symbol clock and a baseband chip clock in a Bluetooth device. A reference frequency, FREF, must be provided by a crystal oscillator or other clock generation device. FREF is a multiple of 1 MHz between 10 and 20 MHz, in this case. Hence FREF=N*1 MHz, where $10 \leq N \leq 20$. In a baseband controller 30, a clock dividing circuit 32 divides FREF to a 1 MHz symbol clock. The 1 MHz baseband symbol clock is used by bit/symbol generation logic 34 to generate the data stream, $b_k$.

FREF is also provided to the transceiver 36, which also includes a divider 38 to generate a 1 MHz clock from FREF. The 1 MHz clock is input to PLL 40 to produce an 8 MHz baseband chip clock. Logic 42 generates the output shown in FIG. 4a responsive to the baseband chip clock.

Generating the output of the transmit filter shown in FIGS. 4a and 4b requires the generation of two clock signals, the baseband symbol clock and the baseband chip clock. Generation of the clock signals can be very costly in terms of area and power if the baseband chip clock is not an integer multiple or division of an available clock. Further, the reference clock, FREF, must be a multiple of 1 MHz. This can be significant, since many communication systems do not use a reference clock that is an integer multiple 1 MHz and, therefore, an additional clock must be generated. For example, CDMA uses a 19.2 MHz reference clock and PDC (Personal Digital Cellular) uses a 12.6 MHz reference clock.

Figure 5:
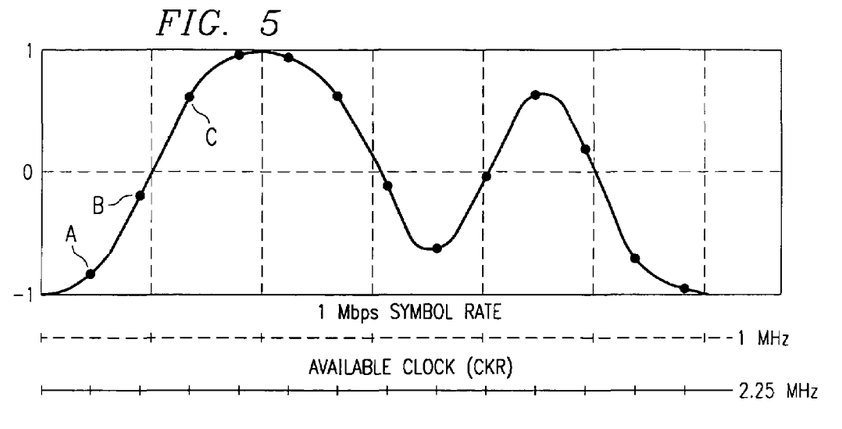
FIG. 5 illustrates the output of an improved transmit filter that does not require use of either the baseband symbol clock or the baseband chip clock.

FIG. 5 illustrates the output of an improved transmit filter that does not require use of either the baseband symbol clock or the baseband chip clock. For comparison with FIG. 4, the 1 MHz baseband symbol clock is shown in phantom. The output of FIG. 5 uses an available clock as a re-timed reference clock, CKR, to generate the output data points. In the illustration, a 2.25 MHz clock is used as CKR, but in a typical application, the frequency of the clock would be at least eight times the frequency of the baseband symbol clock. However, CKR does not need to be a integer multiple of the baseband symbol clock, and it is not generated from the baseband symbol clock or multiple thereof. In a GSM (Global System of Mobile communication) device, for example, a 13 MHz clock would be available for CKR, while a 19.2 MHz clock would be available for a CDMA (Code-Division Multiple Access) device and a 12.6 MHz reference clock would be available for a PDC clock. Each of these clocks would be suitable as CKR for a Bluetooth device having a 1 MHz symbol rate.

Figure 6:
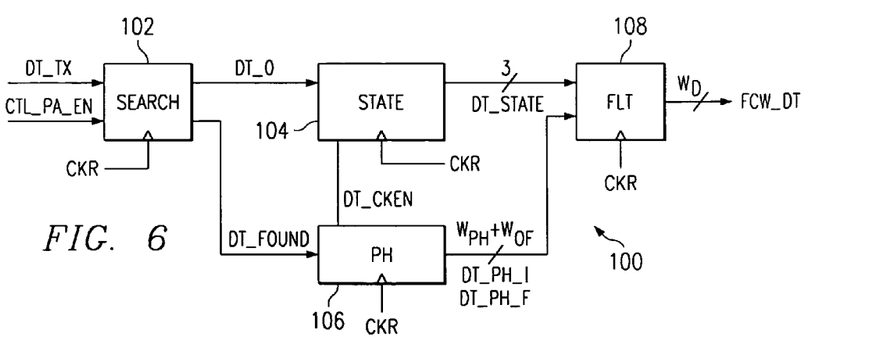
FIG. 6 illustrates a block diagram of a transmit filter that does not require use of either the baseband symbol clock or the baseband chip clock.

FIG. 6 illustrates a block diagram of a transmit filter 100 that generates an output without a baseband symbol or chip clock. The transmit filter 100 comprises four functional blocks, a search circuit 102, a state circuit 104 coupled to the search circuit 102, a phase tracking circuit 106 coupled to the search circuit 102 and a filter circuit 108 coupled to the state circuit 104 and phase tracking circuit 106. The circuits 102-108 are clocked by reference clock CKR, which can be any clock with frequency to plot sufficient output sample points. For example, if the baseband symbol rate is 1 Mbps (megabits per second), typically, CKR should be a clock at eight MHz or above. Accordingly, a 13.5 MHz clock, for example, could be used. The clock does not need to be an integer multiple of the symbol rate.

The search circuit 102, once enabled by control signal CTL_PA_EN, monitors the data input signal DT_TX for a start code. DT_TX could be the $b_k$ signal shown in FIG. 1, where the conversion from binary [0,1] to [−1,+1] for Bluetooth is made implicitly as shown in further detail hereinbelow. For Bluetooth, the start code is "010", but it could vary for other protocols. Once the code is found, DT_FOUND is asserted. The current data value DT_0 is output from the search circuit. The search circuit 102 is described in greater detail in connection with FIGS. 7a-b.

The phase tracking circuit 106 determines a position in the output relative to a hypothetical baseband symbol clock. For example, referring to FIG. 5, and using CKR of 2.25 MHz relative to a data rate of 1 MHz (and assuming the clocks were synchronized at the beginning of the timing diagram), point A would be at a ratio of 4/9 of a first 1 MHz baseband symbol clock cycle, point B would be at a ratio of 8/9 of the first 1 MHz baseband symbol clock cycle, and point C would be at a ratio of 3/9 of a second 1 MHz baseband symbol clock cycle. The current ratio, normalized to the oversampling ratio of the filter 108 (i.e., OSR0, described in connection with FIG. 8a) is output as an unsigned integer part DT_PH_I and a fractional part DT_PH_F. The phase tracking circuit 106 also outputs DT_CKEN to the state circuit 104; DT_CKEN is a pulse roughly in the middle of a DT_0 data bit. The phase tracking circuit 106 is described in greater detail in connection with FIGS. 8a-b.

The state circuit 104 outputs the last three data values, as clocked by CKR (provided the DT_CKEN is asserted) from the phase tracking circuit 106. Thus, the data output DT_0 of the search circuit 102 is sampled at the approximate middle of each data symbol. The state circuit 104 is described in greater detail in connection with FIG. 9.

The filter circuit 108 generates a current output sample point FCW_DT based on the ratio output from the phase tracking circuit 106 and the state circuit 104. The output of the state circuit 104 defines the shape of the curve over a hypothetical baseband symbol clock cycle that an idealized output would have based on the current data point and the previous two data points. The output of the phase tracking circuit 106 defines a present point on the curve. The filter circuit 108 is described in greater detail in connection with FIGS. 10a-c and 11.

Figure 7A:
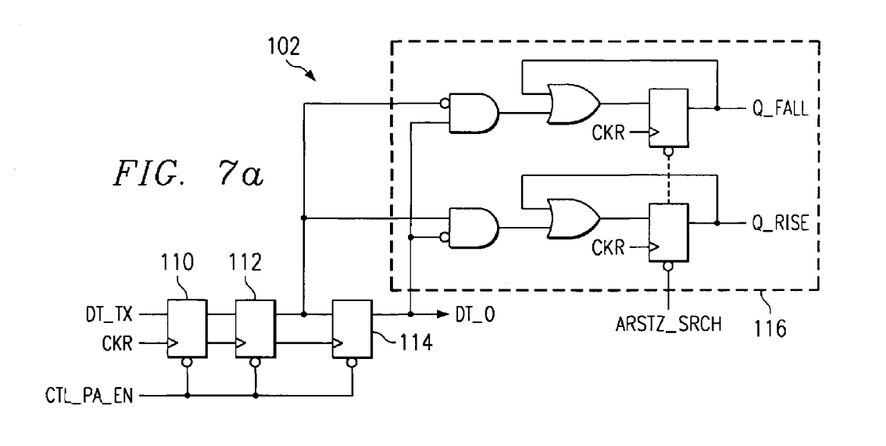
FIGS. 7a and 7b illustrate a schematic view of a search circuit.

FIG. 7a illustrates a schematic view of a portion of the search circuit 102 that detects transitions in DT_TX. Register/latches 110, 112 and 114 are coupled in series to latch the DT_TX signals at the most recent three CKR clocks. Registers/latches 110 and 112 serve to de-metastabilize the DT_TX signal. Register/latches 112 and 114 hold values of DT_TX at consecutive CKR clocks; logic 116 determines whether there has been a transition between the two states. During an edge transition, either Q_FALL or Q_RISE is enabled (but not both), depending upon the direction of the transition.

Figure 7B:
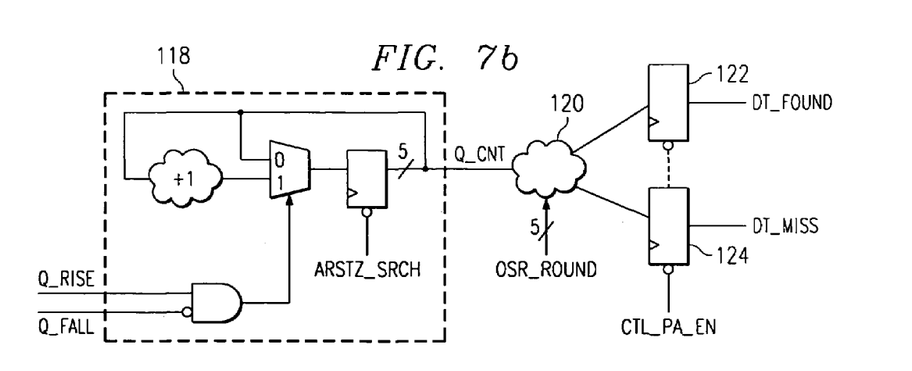

FIG. 7b illustrates a schematic view of a portion of the search circuit 102 that determines the length of a pulse on DT_TX to ensure that it is a valid "1" data state. Logic 118 counts CKR clock cycles between a detected rising transition and a detected falling transition. This count is shown as Q_CNT. After the falling transition, OSR_ROUND, the expected length of a valid "1" pulse, is compared to Q_CNT in logic 120. If OSR_ROUND and Q_CNT are within a predetermined threshold (for example, two CKR clock cycles), DT_FOUND is enabled at an output of register/latch 122; otherwise DT_MISS is enabled at an output of register/latch 124.

Figure 8A:
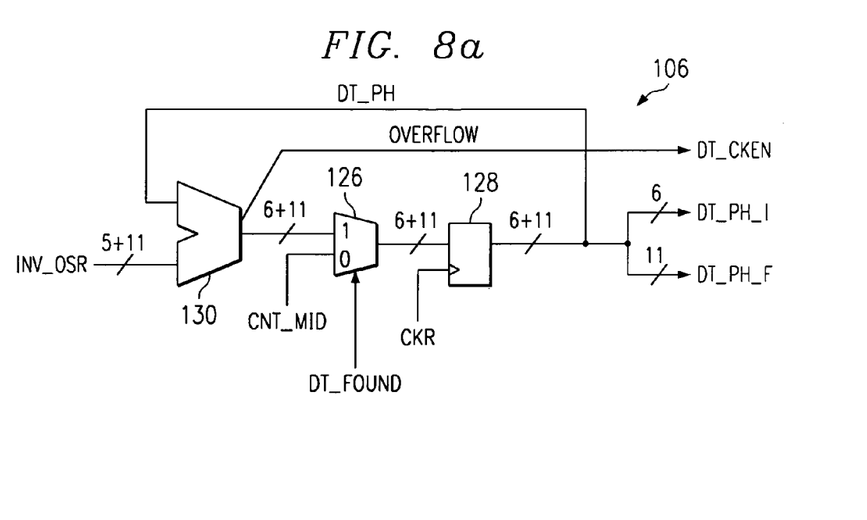
FIG. 8a illustrates a schematic view of a phase tracking circuit.

FIG. 8a illustrates a schematic view of the phase tracking circuit 106. Before DT_FOUND is enabled, a value CNT_MID is entered in register 128 via multiplexer 126. Register 128 stores the running count, DH_PH (where DT_PH_I is the integer portion of DH_PH and DT_PH_F is the fractional portion of DH_PH), computed by adder 130. CNT_MID is a value approximately one-half of the number of CKR cycles per data symbol and is used to locate the approximate midpoint of a symbol. Within the phase tracking circuit 106, a clock cycle of a baseband symbol clock is divided into a predetermined number (OSR0) units, typically a power of 2, such as $2^6$. In the illustrated embodiment, OSR0 is set to 64 units; hence CNT_MID is set to about 32. For each CKR clock cycle, a value INV_OSR is added to DH_PH by adder 130—thus, on each CKR clock cycle, DH_PH=DH_PH+INV_OSR. INV_OSR is equal to the number of units equal to a length of the CKR clock cycle. For example, for a 1 MHz baseband symbol clock and a 13 MHz CKR (with OSR0=64), there would be 13 CKR cycles for each baseband clock cycle, and hence INV_OSR would equal to 64/13 units per CKR clock cycle. INV_OSR and DH_PH have integer and fractional fields for high accuracy.

Figure 8B:
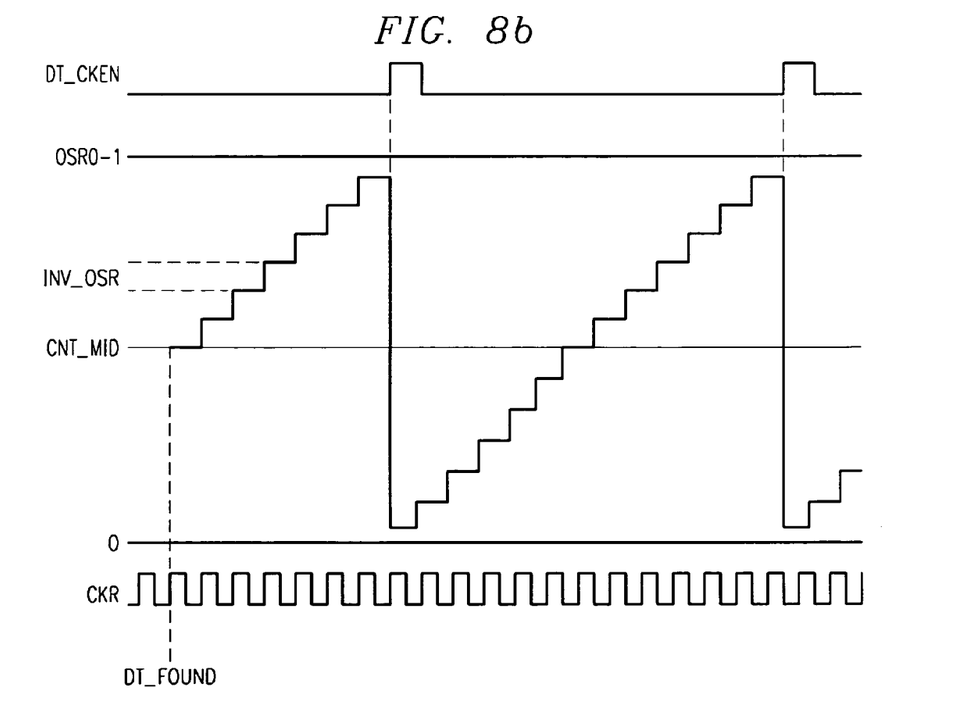

If adder 130 has an integer bit length equal to the minimum bit length for OSR0 (i.e., a bit length of six for OSR0=64), then the overflow will be asserted when the addition of INV_OSR to DH_PH equals or exceeds OSR0. FIG. 8b illustrates the value of DH_PH over time for OSR0=64 and INV_OSR=64/13. The integer and fractional portions of DH_PH, i.e., DT_PH_I and DT_PH_F are output to the filter circuit 108. These indicate a position of an output sample point. For example, for OSR=64, if DT_PH_I=32 and DT_PH_F=0, then the output of the phase tracking circuit indicates that an output sample point should be generated for an output curve midway through a hypothetical baseband symbol clock cycle.

Figure 9:
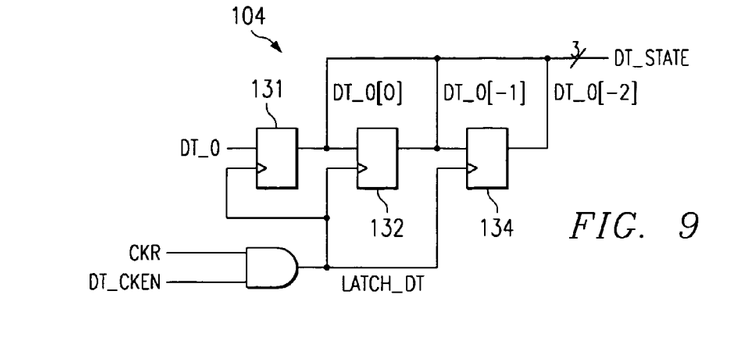
FIG. 9 illustrates a schematic representation of a state circuit.

FIG. 9 illustrates a schematic representation of the state circuit 104. Register/latches 131, 132 and 134, connected in series latch the three most current values of DT_0 from search circuit 102 responsive to LATCH_DT, which is a logical AND of the CKR and DT_CKEN signals. Since DT_CKEN is enabled once per hypothetical baseband symbol clock cycle, the three most recent values of DT_0 are available as DT_STATE. The output of register/latch 132 is DT_0[−1], the data value from the previous baseband symbol clock cycle and the output of register/latch 134 is DT_0[−2], the data value from two previous baseband clock cycles. Register/latch 131 holds the current value of DT_0.

Figure 10A:
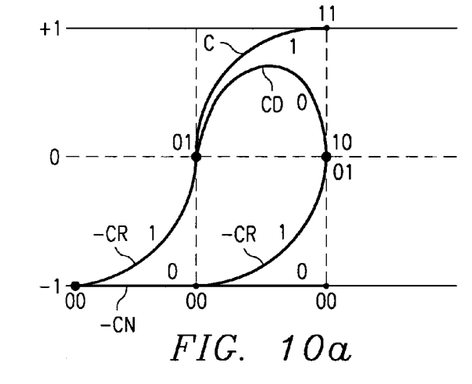
FIGS. 10a, 10b and 10c illustrate curves for various state transitions based on previous symbol values.
Figure 10B:
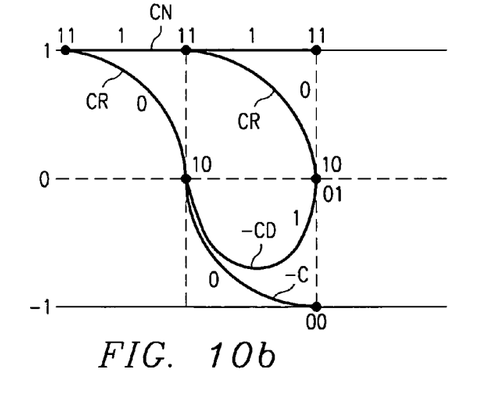
Figure 10C:
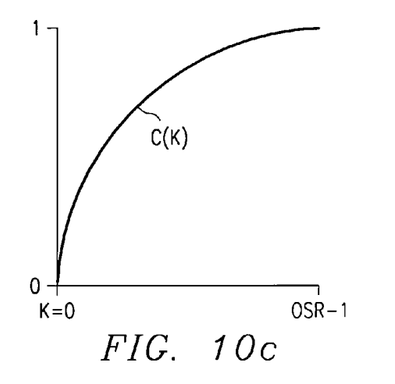

FIGS. 10a through 10c illustrate curves for various state transitions based on the previous two symbol values, DT_0[−2] and DT_0[−1]. In FIG. 10a, starting from a state of "00", if the current DT_0 is a "1", the next state will be "01". On the other hand, if the current DT_0 is a "0", the next state will be "00". In Bluetooth, the output will vary between "+1" and "−1". A state of "00" will be at −1. If the current DT_0 is a "0", the output will remain at "−1" and the new state will be "00". If the current DT_0 is a "1", the output will transition to "0" and the new state will be "01". From state "01" if the current DT_0 is "0", the output will transition from a start value of "0" to an end value of "0", but because of the preceding "01" transition, the output will have an upwards curve between the starting and ending points. The new state will be "10". If the current DT_0 is "1" from state "01", the output will transition from a start value of "0" to an end value of "+1". The new state will be "11".

FIG. 10b illustrates the various state transitions from a starting state of "11" having an output value of "+1". These output curves are the same as the curves in 10a, except flipped over a horizontal axis.

The various curves of FIGS. 10a and 10b are related. The 011 transition is defined by curve C. Curve C is a function of index "k", where 0<=k<=OSR0−1. Data points for C(k) can be stored in a memory in the filter circuit 108. While the output varies from a real-valued "0" to a real-valued "1", the values for C(k) could be represented, for example, by a 9-bit value. From the C(k) points, the data points for all the other curves shown in FIGS. 10a-b can be computed, namely:

CR(k)=C(OSR0−k) (with C(OSR0)=+1 implied)
CD(k)=C(k)+C(OSR0−k)−C(OSR0−1)
CN(k)=C(OSR0−1) (i.e., set to +1)

The remaining curves are the numeric inverses of these curves, namely -C(k), -CR(k), -CD(k) and -CN(k).

The current output curve can be easily determined by the DT_STATE field from the state circuit 104, as shown in Table 1.

TABLE 1

Output Curves

| DT_STATE | | | |
|---|---|---|---|
| DT_0[−2] | DT_0[−1] | DT_0 | Curve |
| 0 | 0 | 0 | −CN(k) |
| 0 | 0 | 1 | −CR(k) |
| 0 | 1 | 0 | CD(k) |
| 0 | 1 | 1 | C(k) |
| 1 | 0 | 0 | −C(k) |
| 1 | 0 | 1 | −CD(k) |
| 1 | 1 | 0 | CR(k) |
| 1 | 1 | 1 | CN(k) |

Figure 11:
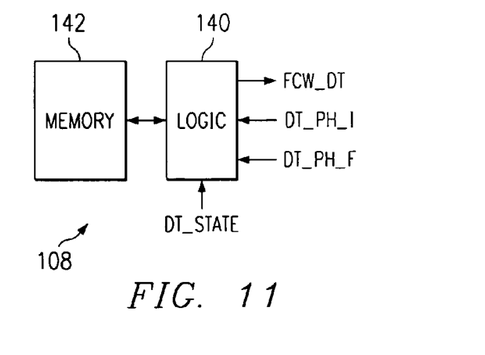
FIG. 11 illustrates an embodiment of a filter circuit.

FIG. 11 illustrates an embodiment of the filter circuit 108. Logic 140 receives the outputs DT_PH_I and DT_PH_F from the phase tracking circuit 106 and DT_STATE from the state circuit 104. DT_PH_F is used to round DT_PH_I to the nearest integer. The rounded DT_PH_I can be used as the index k for the curve indicated by DT_STATE to generate the sample point.

In the preferred embodiment, the values for all the curves shown in Table 1, except C(k) (whose sample point data is stored in ROM/RAM memory 142), are calculated at start-up using combinational logic and are available for immediate output in response to the DT_STATE and DT_PH_I (which may be rounded up based on DT_PH_F) values for each CKR clock. Alternatively, the sample point data for all curves shown in Table 1 could be stored in a memory or register/latch for immediate output. The number of sample data points per symbol can vary; however, in the preferred embodiment, each symbol is represented by a number of points equal to a power of 2. For example, sixty-four data points may be used for each symbol and hence memory 142 would have sixty-four addressable locations for each sample curve.

In an alternative embodiment, sample point data for two different transfer functions, for example Bluetooth and GSM, could be stored in memory 142 or in multiple RAM or ROM memories. The appropriate sample point data could be selected depending upon the desired transfer function. If a RAM is used, the appropriate sample point data could be stored in the RAM at initiation.

Figure 12:
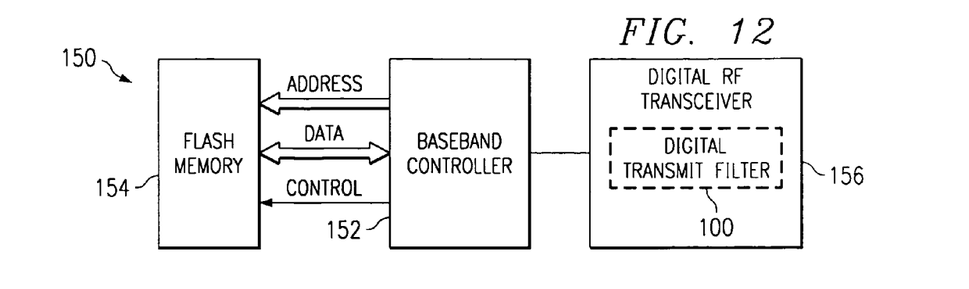
FIG. 12 illustrates a telecommunications device using the transmit filter of FIG. 6.

FIG. 12 illustrates a preferred embodiment of a telecommunication device 150 using the transmit filter. A baseband controller 152 is coupled to a memory 154 and a digital RF transceiver 156, which includes the digital transmit filter 100 described above. Because the transmit filter 100 does not require analog devices, it can be easily integrated with other processing circuitry using deep-submicron CMOS processes.

As described above, an important advantage of the present invention is its ability to use any available clock to generate the samples, so long as a sufficient number of samples can be generated for each symbol. Since many communication systems provide a reference clock in the range of 13 MHz to 20 MHz, an available reference clock is readily available for a system that uses a symbol data rate on the order of 1 MHz, such as Bluetooth.

Figure 13:
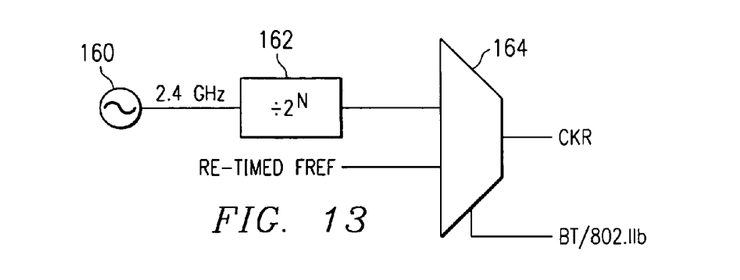
FIG. 13 illustrates a telecommunications device for providing multiple reference clocks to support multiple communication standards.

For communications systems that use a much higher symbol data rate, such as the IEEE 802.11 b wireless LAN (local area network) standard, which provides 11 Mbps transmission (with a fallback to 5.5, 2 and 1 Mbps) in the 2.4 GHz band, a faster CKR is needed to produce sufficient samples for each symbol. FIG. 13 illustrates a block diagram of a CKR generation circuit that can be used to provide an adequate CKR for either Bluetooth and 802.11 networks.

In FIG. 13, the output of a 2.4 GHz VCO (voltage controlled oscillator) or DCO (digitally controlled oscillator) 160 is coupled to a frequency divider circuit 162, which divides the DCO/VCO output down to a frequency suitable for generating samples for an 802.11 symbol stream. The 2.4 GHz signal is commonly used in wireless communication devices. A multiplexer 164 selects between the output of the divider 162 and FREF, which is an available clock suitable to provide sufficient samples for Bluetooth, such as the 13 MHz GSM clock. A control signal BT/802.11 b control signal controls which input is used as CKR, depending upon the application.

In operation, the divider 162 can divide the VCO/DCO output to an appropriate frequency. For example, using an VCO/DCO output of 2.4 GHz and a divider value of 16 (N=4), a CKR clock frequency of 150 MHz can used, providing approximately 13.6 samples per symbol. The same circuit could be used to pass FREF as the CKR clock for 1 MHz Bluetooth applications.

While the embodiment of FIG. 13 has been described in connection with a circuit that is able to accommodate 802.11 and Bluetooth symbol rates, different frequencies could be provided to support other communication standards as well. Further, more than two standards could also be provided using different available clocks and/or multiple divider circuits.

Figure 14:
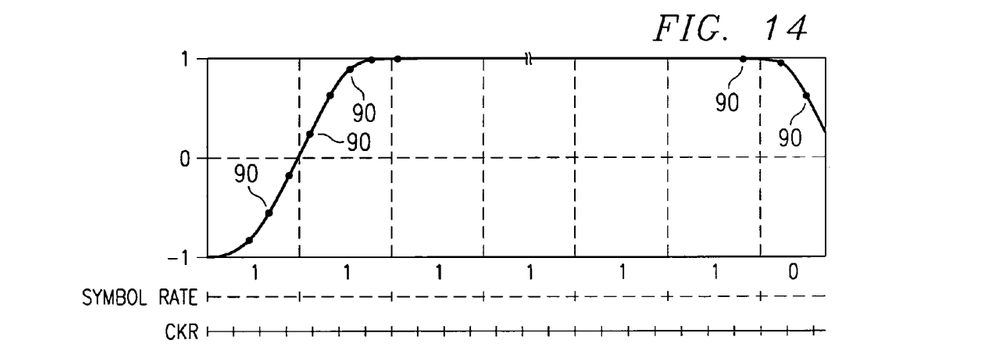
FIG. 14 illustrates an alternative embodiment of selectively generating samples, to reduce the number of transitions in the filter circuit.

FIG. 14 illustrates an output where the embodiment uses, at least partially, sample points that are not output on every CKR clock cycle, but are instead output as necessary in order to reduce transitions and, hence, save power.

In FIG. 14, a string of 1's (mapped to +1) are shown following a "00" state (mapped to −1). Once the samples have been output to show the −1 to +1 transition, all remaining samples will remain at +1, until a "0" is received. A similar situation would occur in response to a string of 0's. In this case, it is possible to reduce the samples generated, since no active modulation is occurring.

There are circumstances that may benefit from generating sample points on less than every CKR clock cycle. One situation would occur if the frequency of CKR is much greater than the baseband symbol clock, thereby causing the generation excessive sample points. For example, if eights sample points per symbol are deemed sufficient, then, for a 1 MHz symbol clock, a CKR frequency on the order of 8 MHz would be appropriate. But, if the only available clock was 40 MHz, for example, it may be desirable to reduce the number of sample points 90 rather than generate nearly twice as many as necessary, which would cause excessive power consumption, particularly in the filter circuit 108. In this case, logic could randomly select instances where a sample point would not be generated. In the above example, if four out of five potential sample points were not generated, the goal of 8 sample points per symbol would be accomplished. Every fifth sample point could be chosen for output; however, in some circumstances is may be beneficial to randomly chose sample points for generation, where one out of five would be chosen on average, which would reduce spurs on the RF output.

In another example, it may be desirable to deterministically prevent sample points from being generated. For example, during a critical analog operation, it may be beneficial to eliminate as much substrate noise as possible. In this case, a logic circuit could inhibit the generation of sample points during the analog operation.

Figure 15:
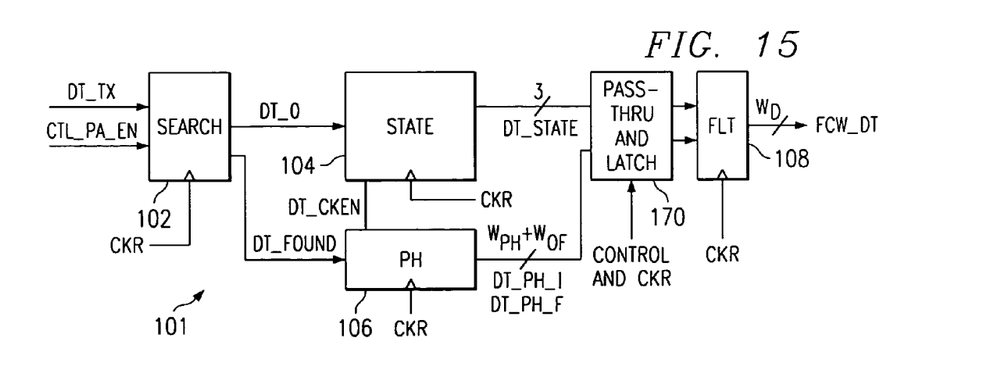
FIG. 15 illustrates a block diagram of a circuit that could be used to reduce the number of sample points generated.

FIG. 15 illustrates a block diagram of a circuit 101 that could be used in order to reduce the number of sample points generated, either in a deterministic or random manner. FIG. 15 is similar to FIG. 6, with the addition of pass-thru and latch logic circuit 170 interposed before the filter circuit 108. Pass-thru and latch logic 170 receives DT_STATE from the state circuit 104 and DT_PH_I and DT_PH_I from phase tracking circuit 106. These signals are passed through to filter circuit 108 responsive to control signals from other logic (not shown) that determines whether a sample point 90 should be generated.

The embodiment shown in FIGS. 14 and 15 is only one example of how samples can be generated under deterministic or random control.

Although the Detailed Description of the invention has been directed to certain exemplary embodiments, various modifications of these embodiments, as well as alternative embodiments, will be suggested to those skilled in the art. The invention encompasses any modifications or alternative embodiments that fall within the scope of the claims.

The invention claimed is:

1. A transmit filter for generating an oversampled signal from a stream of data symbols generated responsive to a symbol clock, comprising:

circuitry for receiving the data symbol stream;
phase tracking circuitry, responsive to a reference clock generated independently from the symbol clock, for maintaining phase information relative to the symbol clock; and
sample generating circuitry for generating samples responsive to said phase information.

2. The transmit filter of claim 1 wherein said sample generating circuitry generates samples at an active edge of said reference clock.

3. The transmit filter of claim 2 wherein said sample generating circuitry generates samples on each clock cycle of said reference clock.

4. The transmit filter of claim 2 wherein said sample generating circuitry generates samples on selected clock cycles of said reference clock.

5. The transmit filter of claim 1 wherein said reference clock comprises the output of a frequency divider.

6. The transmit filter of claim 1 wherein said reference clock is selectable from two or more clock signals.

7. The transmit filter of claim 1 wherein said phase tracking circuitry comprises circuitry for adding a predetermined value to a stored value on each clock cycle of said reference clock.

8. The transmit filter of claim 7 wherein said predetermined value is a ratio between a frequency associated with said symbol clock and a frequency associated with said reference clock.

9. The transmit filter of claim 1 and further comprising circuitry for storing a current data symbol and a predetermined number of preceding data symbols.

10. The transmit filter of claim 9 wherein said sample generating circuitry comprises circuitry for generating a sample point responsive to said phase information, said current data symbol and one or more of said preceding data symbols.

11. The transmit filter of claim 10 wherein symbol data for generating a sample point is defined by a plurality of transfer function curves.

12. The transmit filter of claim 11 wherein symbol data for one of said curves is stored in a memory and symbol data for other of said curves is derived from said symbol data for said one curve.

13. The transmit filter of claim 11 wherein the symbol data for said one curve comprises a power of two number of data points.

14. The transmit filter of claim 11 wherein said memory stores symbol data for multiple sets of transfer curves.

15. The transmit filter of claim 11 wherein symbol data for multiple sets of transfer curves are stored in respective memories.

16. The transmit filter of claim 1 and further comprising circuitry for identifying an approximate center of a data symbol.

17. The transmit filter of claim 16 and further comprising circuitry for tracking an approximate center for each data symbol in said stream independent of the symbol clock.

18. A method of generating an oversampled signal from a stream of data symbols generated responsive to a symbol clock, comprising the steps of:

receiving the data symbol stream;
maintaining phase information relative to the symbo in clock in response to a reference clock generated independently from the symbol clock; and
generating samples responsive to said phase information and said reference clock.

19. The method of claim 18 wherein said sample generating step comprises the step of generating samples at an active edge of said reference clock.

20. The method of claim 19 wherein said sample generating step comprises the step of generating samples on each clock cycle of said reference clock.

21. The method of claim 19 wherein said sample generating step comprises the step of generating samples on selected clock cycles of said reference clock.

22. The method of claim 18 and further comprising the step of generating the reference clock through a frequency divider.

23. The method of claim 18 and further comprising the step of selecting the reference clock from two or more clock signals.

24. The method of claim 18 wherein said step of maintaining phase information comprises the step of adding a predetermined value to a stored value on each clock cycle of said reference clock.

25. The method of claim 24 wherein said predetermined value is a ratio between a frequency associated with said symbol clock and a frequency associated with said reference clock.

26. The method of claim 18 and further comprising the step of storing a current data symbol and a predetermined number of preceding data symbols.

27. The method of claim 26 wherein said sample generating step comprises the step of generating a sample point responsive to said phase information, said current data symbol and one or more of said preceding data symbols.

28. The method of claim 27 wherein symbol data for generating a sample point is defined by a plurality of transfer function curves.

29. The method of claim 28 and further comprising the steps of storing symbol data for one of said curves is stored in a memory and deriving symbol data for other of said curves from said symbol data for said one curve.

30. The method of claim 28 wherein the symbol data for said one curve comprises a power of two number of data points.

31. The method of claim 28 wherein said storing step comprises the step of storing symbol data for multiple sets of transfer curves in one or more memories.

32. The method of claim 18 and further comprising the step of identifying an approximate center of a data symbol.

33. The method of claim 32 and further comprising the step of tracking an approximate center for each data symbol in said stream independent of the symbol clock.

34. A transmit filter for generating an oversampled signal from a stream of data symbols generated responsive to a symbol clock, comprising:
   circuitry for receiving the data symbol stream;
   phase tracking circuitry, responsive to a reference clock, for maintaining phase information relative to the symbol clock; and
   sample generating circuitry for selectively generating samples responsive to said phase information and said symbol clock.

35. The transmit filter of claim 34 wherein said sample generating circuitry generates samples on randomly selected cycles of said reference clock.

36. The transmit filter of claim 34 wherein said sample generating circuitry generates samples on deterministically selected cycles of said reference clock.

* * * * *